(12) United States Patent
Yu et al.

(10) Patent No.: US 8,847,388 B2
(45) Date of Patent: Sep. 30, 2014

(54) BUMP WITH PROTECTION STRUCTURE

(75) Inventors: Chen-Hua Yu, Hsinchu (TW);
Hung-Pin Chang, Taipei County (TW);
An-Jhih Su, Bade (TW); Tsang-Jiuh Wu, Hsinchu (TW); Wen-Chih Chiou, Miaoli (TW); Shin-Puu Jeng, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 123 days.

(21) Appl. No.: 13/267,200

(22) Filed: Oct. 6, 2011

(65) Prior Publication Data

US 2013/0087908 A1  Apr. 11, 2013

(51) Int. Cl.
  *H01L 23/48* (2006.01)
  *H01L 23/31* (2006.01)
  *H01L 23/00* (2006.01)
  *H01L 23/29* (2006.01)

(52) U.S. Cl.
  CPC ....... *H01L 23/293* (2013.01); *H01L 2224/1147* (2013.01); *H01L 2224/05686* (2013.01); *H01L 2224/05647* (2013.01); *H01L 2224/05008* (2013.01); *H01L 2224/05022* (2013.01); *H01L 2224/11849* (2013.01); *H01L 2224/11334* (2013.01); *H01L 2924/10253* (2013.01); *H01L 2924/01029* (2013.01); *H01L 23/3192* (2013.01); *H01L 2224/10126* (2013.01); *H01L 2224/05573* (2013.01); *H01L 2224/13116* (2013.01); *H01L 2224/05582* (2013.01); *H01L 2224/0401* (2013.01); *H01L 2224/05147* (2013.01); *H01L 2224/0345* (2013.01); *H01L 2224/13006* (2013.01); *H01L 2224/13113* (2013.01); *H01L 2224/13139* (2013.01); *H01L 2224/13155* (2013.01); *H01L 2224/1146* (2013.01); *H01L 2224/13022* (2013.01); *H01L 2224/05571* (2013.01); *H01L 2224/13147* (2013.01); *H01L 24/13* (2013.01); *H01L 24/03* (2013.01); *H01L 24/11* (2013.01); *H01L 2224/03452* (2013.01); *H01L 2224/13082* (2013.01); *H01L 2224/0346* (2013.01); *H01L 2224/05155* (2013.01); *H01L 2224/05666* (2013.01); *H01L 2224/05124* (2013.01); *H01L 2224/13007* (2013.01); *H01L 234/05* (2013.01); *H01L 2224/05681* (2013.01); *H01L 2224/13111* (2013.01); *H01L 2224/03912* (2013.01)
  USPC ........................... 257/737; 438/106; 438/612

(58) Field of Classification Search
  CPC .................... H01L 24/04; H01L 24/05; H01L 2224/05571; H01L 2224/0401; H01L 2224/10126; H01L 2224/3192
  USPC .................................. 257/737; 438/106, 612
  See application file for complete search history.

(56) References Cited

U.S. PATENT DOCUMENTS 7,271,030 B2 *  9/2007  Bojkov et al. ................. 438/107
7,465,653 B2 * 12/2008  Huang et al. .................. 438/613

(Continued)

OTHER PUBLICATIONS

Strandjord, A. G., et al., "Photosensitive Benzocyclobutene for Stress-Buffer and Passivation Applications (One Mask Manufacturing Process)", 1997 Electronic Components and Technology Conference, pp. 1260-1268.

*Primary Examiner* — Shaun Campbell

(74) *Attorney, Agent, or Firm* — Lowe Hauptman & Ham, LLP

(57) ABSTRACT

A semiconductor device includes a bump structure formed on a post-passivation interconnect (PPI) line and surrounded by a protection structure. The protection structure includes a polymer layer and at least one dielectric layer. The dielectric layer may be formed on the top surface of the polymer layer, underlying the polymer layer, inserted between the bump structure and the polymer layer, inserted between the PPI line and the polymer layer, covering the exterior sidewalls of the polymer layer, or combinations thereof.

11 Claims, 7 Drawing Sheets

(56) References Cited

U.S. PATENT DOCUMENTS

| | | | |
|---|---|---|---|
| 8,022,543 B2 * | 9/2011 | Farooq et al. | 257/753 |
| 2006/0091541 A1 * | 5/2006 | Bojkov et al. | 257/737 |
| 2007/0184643 A1 * | 8/2007 | Rinne | 438/612 |
| 2008/0001290 A1 * | 1/2008 | Chou et al. | 257/751 |
| 2009/0212441 A1 * | 8/2009 | Lin | 257/774 |

* cited by examiner

BUMP WITH PROTECTION STRUCTURE

RELATED APPLICATIONS

The present application is related to co-pending U.S. Ser. No. 13/162,297 filed on Jun. 16, 2011 and co-pending U.S. Ser. No. 13/170,973 filed on Jun. 28, 2011, which are expressly incorporated by reference herein in their entirety.

BACKGROUND

Modern integrated circuits are made up of literally millions of active devices such as transistors and capacitors. These devices are initially isolated from each other, but are later interconnected to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. A solder ball may then be placed on the UBM.

Wafer level chip scale packaging (WLCSP) is currently widely used for its low cost and relatively simple processes. In a typical WLCSP, post-passivation interconnect (PPI) lines such as redistribution lines (RDLs) are formed on passivation layers, followed by the formation of polymer films and bumps. Typically, the WLCSP may be bonded onto a printed circuit board (PCB). To be able to have the option of replacing a defective WLCSP bonded on the PCB with a good WLCSP, no underfill material is filled between the WLCSP and the PCB. Such a configuration, however, limits the die size of the current WLCSP technology, because of the thermal mismatch between the die and the PCB, which can induce solder joint cracking during thermal cycling or a drop test. Currently, there is another concern about the stress induced by the passivation structure over the PPI lines, which might impact the device performance and reliability.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

Figure 1:
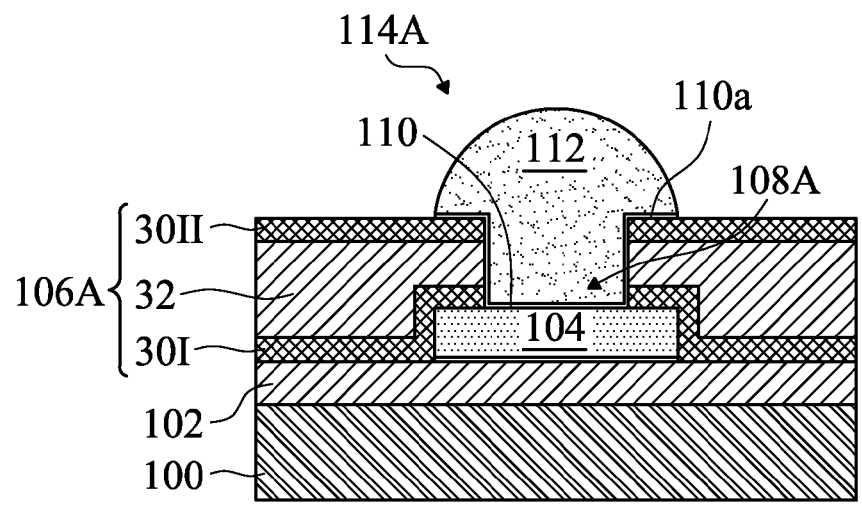
FIG. 1 is a cross-sectional view of a bump structure with a protection structure on a PPI line in accordance with an embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Embodiments described herein relate to the use of bump structures for use with semiconductor devices. As will be discussed below, embodiments are disclosed that utilize a bump structure for the purpose of attaching one substrate to another substrate, wherein each substrate may be a die, wafer, interposer substrate, printed circuit board, packaging substrate, or the like, thereby allowing for die-to-die, wafer-to-die, wafer-to-wafer, die or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 is a cross-sectional view of a bump with a protection structure on a PPI line in accordance with an embodiment.

Referring to FIG. 1, a portion of a device substrate 100 having electrical circuitry formed therein and/or thereupon is shown. The device substrate 100 may include a semiconductor substrate, such as a silicon wafer, a silicon die, a semiconductor-on-insulator (SOI) substrate, or any construction comprising semiconductor materials. Semiconductor devices, such as transistors, capacitors, resistors, diodes, photo-diodes, fuses, and the like, interconnected to perform one or more functions may be formed at the surface of semiconductor substrate. Interconnect structures, which may include metal lines and vias formed in inter-layer dielectric (ILD) layers and electrically coupled to the semiconductor devices, are formed over semiconductor substrate 100. In some embodiments, through-substrate vias (TSVs) are formed in the semiconductor substrate 100 and electrically connected to the interconnect structures. Metal pads may be patterned in a top metallization layer on the top-level ILD layer to be electrically coupled to the semiconductor devices, for example, through the underlying interconnect structures.

A passivation layer 102 is formed on the device substrate 100 and patterned to form an opening (not shown) exposing the underlying metal pad. In one embodiment, the passivation layer 102 is formed of a non-organic material selected from un-doped silicate glass (USG), silicon nitride, silicon oxynitride, silicon oxide, and combinations thereof. In another embodiment, the passivation layer 102 is formed of a polymer layer, such as an epoxy, polyimide, benzocyclobutene (BCB), polybenzoxazole (PBO), and the like, although other relatively soft, often organic, dielectric materials can also be used.

Also, a post-passivation interconnect (PPI) line 104 is formed and patterned on the passivation layer 102. The PPI line 104 may fill the opening of the passivation layer 102 to electrically connect the underlying metal pad. The formation of the PPI line 104, for example, includes depositing a conductive material, using a mask and a photolithography process, and an etching process followed by removing the mask. The PPI line 104 may be formed of a conductive material including, but not limited to, for example copper, aluminum, copper alloy, nickel, or other mobile conductive materials. The deposition method of the PPI line 104 may include plating, electroless plating, sputtering, chemical vapor deposition methods, and the like. The PPI line 104 connects the metal pad to a subsequently-formed bump feature. The PPI line 104 may also function as a power line, re-distribution line (RDL), inductor, capacitor, or any passive component. In one embodiment, the PPI line 104 has a thickness less than about 30 µm, for example between about 2 µm and about 25 µm.

Next, a protection structure 106A is formed on the PPI line 104 and patterned to form an opening 108A exposing a portion of the PPI line 104. The exposed portion of the PPI line 104 is a landing pad region on which a bump structure 114A is then formed. In one embodiment, the bump structure 114A includes an under-bump metallization (UBM) layer 110 and a conductive bump 112 formed in the opening 108A. The UBM layer 110 lines the sidewalls and bottom of the opening 108A. The UBM layer 110 may further include portions directly over the protection structure 106A to form overhang portions 110a. The conductive bump 112 is formed on the UBM layer 110 to fill the opening 108A, which may protrude from the top surface of the protection structure 106A. The device substrate 100 may then be sawed and packaged onto a package substrate, or another die, with solder balls or Cu posts mounted on a pad on the package substrate or the other die.

In one embodiment, the UBM layer 110 includes a diffusion barrier layer and/or a seed layer. The diffusion barrier layer may be formed of tantalum nitride, although it may also be formed of other materials such as titanium nitride, tantalum, titanium, or the like. The seed layer may be a copper seed layer formed on the diffusion barrier layer. The seed layer may be formed of copper alloys that include silver, chromium, nickel, tin, gold, and combinations thereof. In one embodiment, the UBM layer 110 includes a diffusion barrier layer formed of Ti and a seed layer formed of Cu. The conductive bump 112 may include a metal layer, a solder layer, or combinations thereof. The metal layer in the conductive bump 112 may include a copper layer, a copper alloy layer, a nickel layer, a nickel alloy layer, or combinations thereof. The solder layer in the conductive bump 112 may include a lead-free pre-solder layer, SnAg, or a solder material including alloys of tin, lead, silver, copper, nickel, bismuth, or combinations thereof.

The protection structure 106A formed over the PPI line 104 and surrounding the bump structure 114A is to create a stress-buffer passivation scheme and eliminate out-gassing problems associated with polymer materials as well. In one embodiment, the protection structure 106A includes a polymer layer 32 sandwiched by a first protective layer 30I and a second protective layer 30II. The polymer layer 32 has a thickness between about 30 µm and about 200 µm. With a great thickness, the polymer layer 32 acts as an efficient stress buffer. The polymer layer 32 may be formed of a polymer material, such as an epoxy, polyimide, benzocyclobutene (BCB), polybenzoxazole (PBO), and the like, although other relatively soft, often organic, dielectric materials can also be used. In one embodiment, the polymer layer 32 is a polyimide layer. The polymer layer 32 is soft and easily formed to a thickness of tens of microns, and hence has the function of reducing inherent stresses on respective substrate.

The formation of the polymer layer 32 may need the steps of coating, curing, descum and the like. However, improperly or incompletely cured polymer may result in emission of corrosive gases or out-gassing problems, causing physical/electrical reliability issues. In order to eliminate out-gassing problems associated with the polymer layer 32, the first protective layer 30I formed underlying the polymer layer 32 is inserted between the PPI line 104 and the polymer layer 32 and inserted between the bottom portion of the bump structure 114A and the polymer layer 32, and hence has the function of blocking released moisture from the polymer layer 32. Also, the second protective layer 30II formed on the polymer layer 32 is inserted between the top portion of the bump structure 114A, and hence has the function of capping released moisture from the polymer layer 32 to avoid bump adhesion issues and failures on package components during or after manufacture. In one embodiment, the first protective layer 30I is formed of a dielectric material including silicon nitride, silicon carbide, silicon carbonitride, silicon oxycarbide, tetra-ethyl-ortho-silicate (TEOS) oxide, silicon oxide, multi-layers thereof and/or combinations thereof by PECVD techniques or high-density plasma CVD (HDPCVD), or the like. In one embodiment, the second protective layer 30II formed of a dielectric material including silicon nitride, silicon carbide, silicon carbonitride, silicon oxycarbide, tetra-ethyl-ortho-silicate (TEOS) oxide, silicon oxide, multi-layers thereof and/or combinations thereof by PECVD techniques or high-density plasma CVD (HDPCVD), or the like. In one embodiment, the first protective layer 30I has a thickness less than about 2 µm, for example between about 0.2 µm and about 1 µm. In another embodiment, the second protective layer 30I has a thickness less than about 2 for example between about 0.11 µm and about 0.5 µm.

The embodiment shown in FIG. 1 utilizes the protection structure 106A with the polymer layer 32 to create a stress buffer passivation scheme associated with the PPI line 104 and the bump structure 114A, and utilizes the protection structure 106A with the protective layers 30I and 30II to block and cap the released moisture associated with the polymer layer 32 to eliminate the out-gassing problems as well. This improves physical/electrical performance and reliability of the bump structure 114A and the PPI line 104. Also, the protection structure 106A surrounds and attaches the PPI line 104 and the bump structure 114A, and hence provides better mechanical strength to the bump structure 114A and becomes applicable to a larger metal-to-metal contact area.

Figure 2:
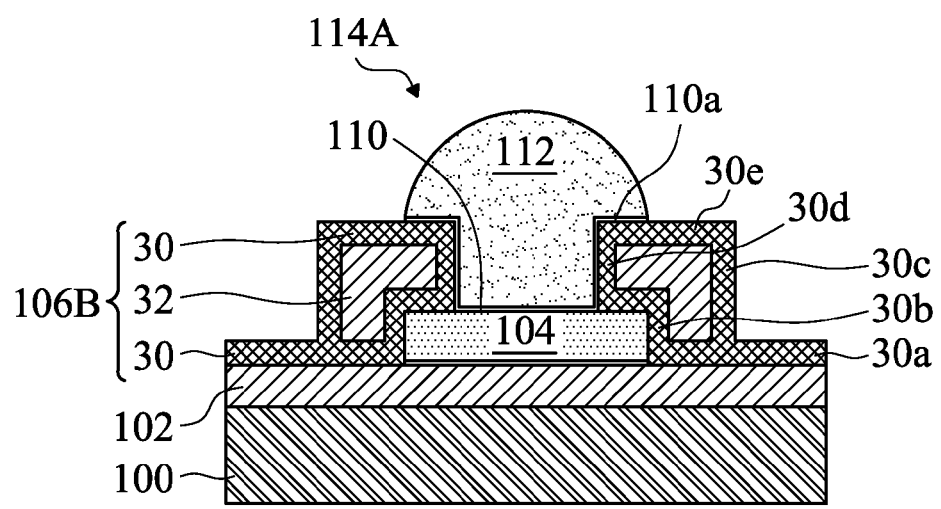
FIGS. 2-4 are cross-sectional views of bump structures with protection structures in accordance with various alternative embodiments.

FIG. 2 illustrates a protection structure in accordance with an alternative embodiment. Unless specified otherwise, the reference numerals in these embodiments represent like elements in the embodiment illustrated in FIG. 1. Particularly, the structure, material, and the thickness in these embodiments may be essentially the same as those that are shown in FIG. 1. With reference to FIG. 2, an alternative protection structure 106B includes the polymer layer 32 completely blocked by the protective layer 30 and separated from the bump structure 114A and the PPI line 104. In one embodiment, the protective layer 30 includes a first portion 30a formed on the passivation layer 102, a second portion 30b extending to the sidewalls and peripheral edges of the PPI line 104, a third portion 30c covering the exterior sidewall of the polymer layer 32, a fourth portion 30d formed between the sidewall of the bump structure 114A and the polymer layer 32, and a fifth portion 30e formed on the top of the polymer layer 32. The polymer layer 32 is therefore blocked by the protective layer 30.

Figure 3:
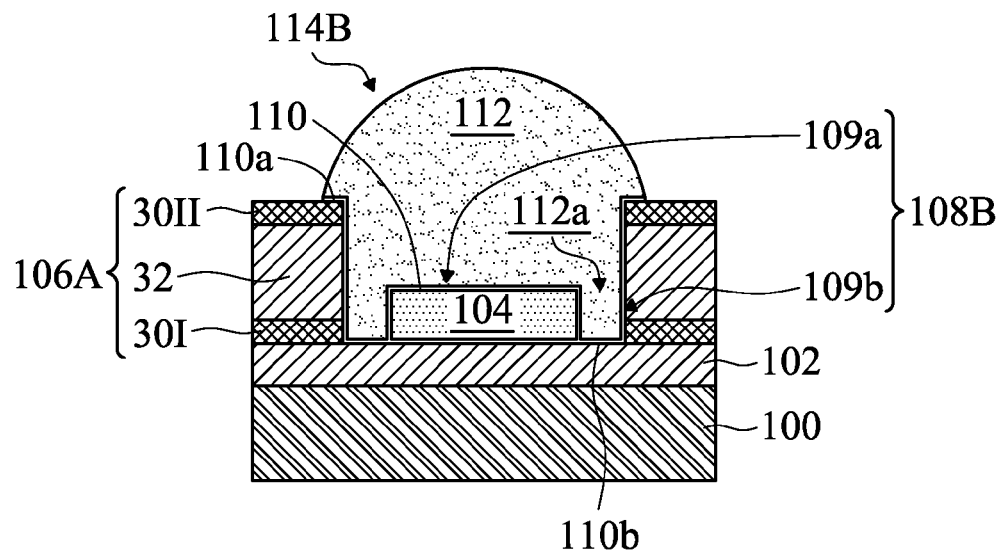

FIG. 3 illustrates a bump structure in accordance with an alternative embodiment. Unless specified otherwise, the reference numerals in these embodiments represent like elements in the embodiment illustrated in FIG. 1. Particularly, the structure, material, and the thickness in these embodiments may be essentially the same as those that are shown in FIG. 1. With reference to FIG. 3, an alternative bump structure 114B is formed in an opening 108B patterned in and passing through the protection structure 106A. The opening 108B has a main opening 109a exposing the top surface of the PPI line 104 and a peripheral opening 109b exposing the sidewalls of the PPI line 104 and the passivation layer 102 adjacent to the PPI line 104. Accordingly, compared with the UBM layer shown in FIG. 1, the UBM layer 110 lining the opening 108B further includes an extending portion 110b which is directly over the exposed sidewalls of the PPI line 104 and the exposed surface of the passivation layer 102. Also, the conductive bump 112 formed in the opening 108B further includes an extending portion 112a which fills the opening 109b and surrounds the sidewalls of the PPI line 104.

Figure 4:
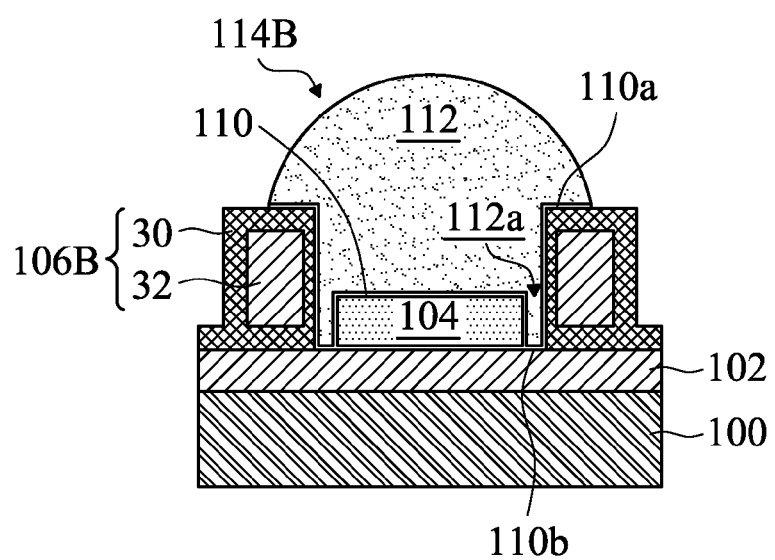

FIG. 4 illustrates a protection structure in accordance with an alternative embodiment. Unless specified otherwise, the reference numerals in these embodiments represent like elements in the embodiment illustrated in FIG. 1 and FIG. 3. Particularly, the structure, material, and the thickness in these embodiments may be essentially the same as what are shown in FIG. 1 and FIG. 3. With reference to FIG. 4, an alternative protection structure 106B includes the polymer layer 32 completely blocked by the protective layer 30 and separated from the bump structure 114B and the PPI line 104.

FIGS. 5-9 illustrate various intermediate stages of an exemplary method of forming the bump structure 114A with the protection structure 106A in a semiconductor device in accordance with an embodiment shown in FIG. 1. Unless specified otherwise, the reference numerals in these embodiments represent like elements in the embodiment illustrated in FIG. 1.

Figure 5:
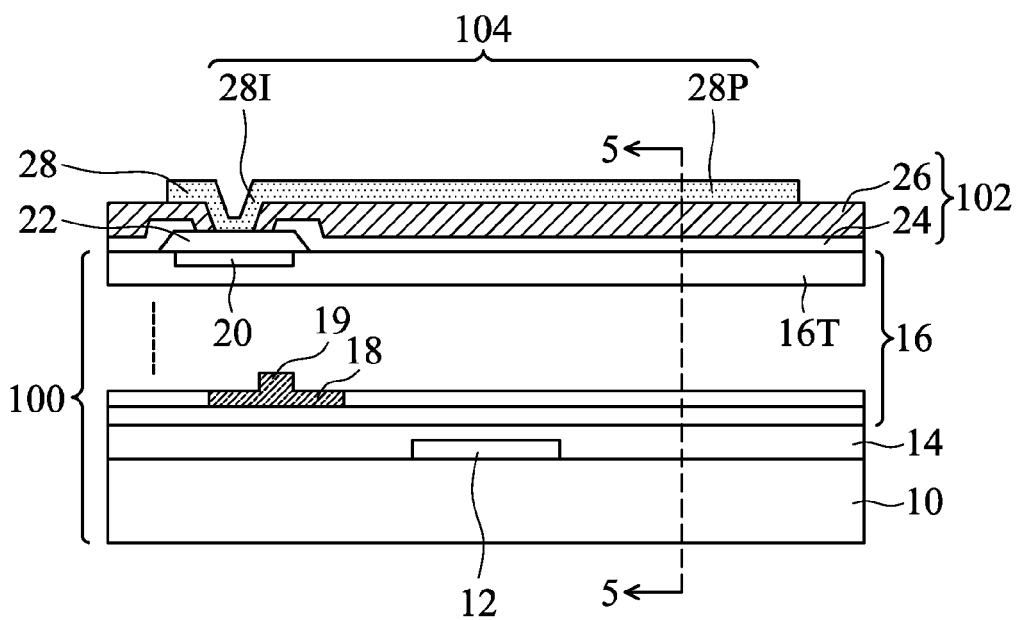
FIGS. 5-9 are cross-sectional views illustrating various intermediate stages of an exemplary method of forming a bump structure with a protection structure in a semiconductor device in accordance with an embodiment shown in FIG. 1.

Referring to FIG. 5, a portion of the device substrate 100 having an electrical circuitry 12 formed in and/or a semiconductor substrate 10 is shown. The semiconductor substrate 10 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon substrate or a glass substrate. Other substrates, such as a multi-layered or gradient substrate may also be used. The electrical circuitry 12 formed on the substrate 10 may be any type of circuitry suitable for a particular application. In an embodiment, the electrical circuitry 12 includes electrical devices formed on the substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 5 is an inter-layer dielectric (ILD) layer 14 on the electrical circuitry 12. The ILD layer 14 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). It should also be noted that the ILD layer 14 may comprise a plurality of dielectric layers. Contacts (not shown) may be formed through the ILD layer 14 to provide an electrical contact to the electrical circuitry 12. The contacts may be formed of, for example, one or more layers of TaN, Ta, TiN, Ti, CoW, copper, tungsten, aluminum, silver, or the like, and combinations thereof.

One or more inter-metal dielectric (IMD) layers 16 and the associated metallization layers 18 are formed over the ILD layer 14. Generally, the one or more IMD layers 16 and the associated metallization layers (such as metal lines 18 and vias 19) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. It should be noted that one or more etch stop layers (not shown) may be positioned between adjacent ones of the dielectric layers, e.g., the ILD layer 14 and the IMD layers 16. Generally, the etch stop layers provide a mechanism to stop an etching process when forming vias and/or contacts. The etch stop layers are formed of a dielectric material having a different etch selectivity from adjacent layers, e.g., the underlying semiconductor substrate 10, the overlying ILD layer 14, and the overlying IMD layers 16. In an embodiment, etch stop layers may be formed of SiN, SiCN, SiCO, CN, combinations thereof, or the like, deposited by CVD or PECVD techniques. The metallization layers may be formed of copper or copper alloys, although they can also be formed of other metals. One skilled in the art will realize the formation details of the metallization layers. Further, the metallization layers include a top metal layer 20 formed and patterned in or on the uppermost IMD layer 16T to provide external electrical connections and to protect the underlying layers from various environmental contaminants. The uppermost IMD layer 16T may be formed of a dielectric material, such as silicon nitride, silicon oxide, undoped silicon glass, and the like. In subsequent drawings, semiconductor substrate 10, electrical circuitry 12, ILD layer 14, IMD layers 16, and metallization layers 18 and 19 are not illustrated. The top metal layer 20 is formed as a part of the top metallization layer on the uppermost IMD layer 16T. Hereafter, a conductive pad 22 is formed and patterned to contact the top metal layer 20, or alternatively, electrically coupled to top metal layer 20 through a via. The conductive pad 22 may be formed of aluminum, aluminum copper, aluminum alloys, copper, copper alloys, or the like.

With reference to FIG. 5, one or more passivation layers, such as passivation films 24 and 26 are formed and patterned to become the passivation layer 102, which exposes a portion of the conductive pad 22. In one embodiment, the first passivation film 24 is formed over the uppermost IMD layer 16T and then patterned to form an opening exposing a portion of conductive pad 22. Then the second passivation film 26 is formed on the first passivation film 24 and then patterned to form a relatively larger opening exposing the central portion of conductive pad 22. The passivation films 24 and 26 may be formed of a dielectric material, such as undoped silicate glass (USG), silicon nitride, silicon oxide, silicon oxynitride or a non-porous material by any suitable method, such as CVD, PVD, or the like. The passivation films 24 and 26 may be a single layer or a laminated layer. One of ordinary skill in the art will appreciate that a single layer of conductive pad and a passivation layer are shown for illustrative purposes only. As such, other embodiments may include any number of conductive layers and/or passivation layers.

Thereafter, the post-passivation interconnect (PPI) line 104 is formed and patterned on the passivation layer 102. The PPI line 104 passes through the passivation layer 102 so as to electrically connect the conductive pad 22. In an embodiment, the PPI line 104 includes an interconnect line region 281 and a landing pad region 28P. The interconnect line region 281 and the landing pad region 28P may be formed simultaneously, and may be formed of a same conductive material. A bump feature will be formed over and electrically connected to the landing pad region 28P in subsequent processes. The PPI line 104 may include, but is not limited to, for example copper, aluminum, copper alloy, or other mobile conductive materials using plating, electroless plating, sputtering, chemical vapor deposition methods, and the like. In some embodiments, the PPI line 104 may further include a nickel-containing layer (not shown) on top of a copper-containing layer. In some embodiments, the PPI line 104 may also function as a power line, re-distribution line (RDL), inductor, capacitor or any passive component. Through the routing of PPI line 104, the landing pad region 28P may be, or may not be, directly over the conductive pad 22.

The subsequent processes for manufacturing the protection structure and the bump structure on the PPI line are described and shown associated with cross-sectional views along the line 5-5 of FIG. 5. Some elements are omitted in the FIGS. 6-9 for simplicity and clarity.

Figure 6:
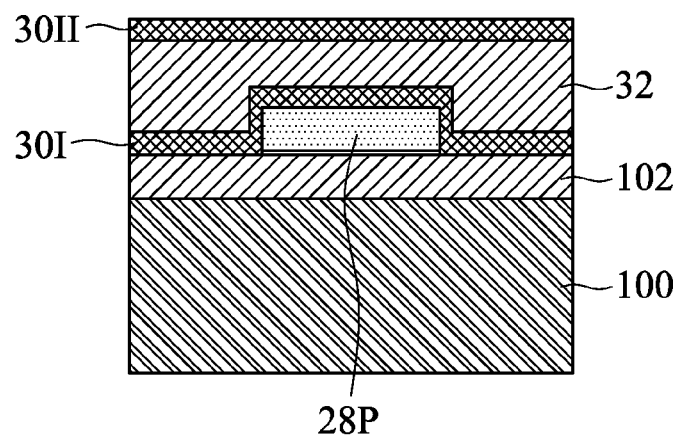

Referring to FIG. 6, the first protective layer 30I, the polymer layer 32 and the second protective layer 30II are successively formed on substrate 100. The polymer layer 32 is formed of a polymer selected from epoxy, polyimide, benzocyclobutene (BCB), polybenzoxazole (PBO) and the like. In an embodiment, the polymer layer 32 is a laminate film. The polymer layer 32 may have a relatively high elasticity. Furthermore, the polymer layer 32 may be formed of material that is suitable to form a laminate film before being cured. To reduce the cost of the patterning step for forming opening, the polymer layer 32 may also be formed of a photosensitive material, which may be patterned easily after exposure. Thickness of the polymer layer 32 may be greater than 30 µm, and may be greater than about 100 µm. Thickness of the polymer layer 32 may also be between about 30 µm and about 200 µm. With a great thickness, the polymer layer 32 acts as an efficient stress buffer. The dimensions recited throughout the description are merely examples, and will be scaled with the downscaling of integrated circuits.

Figure 7:
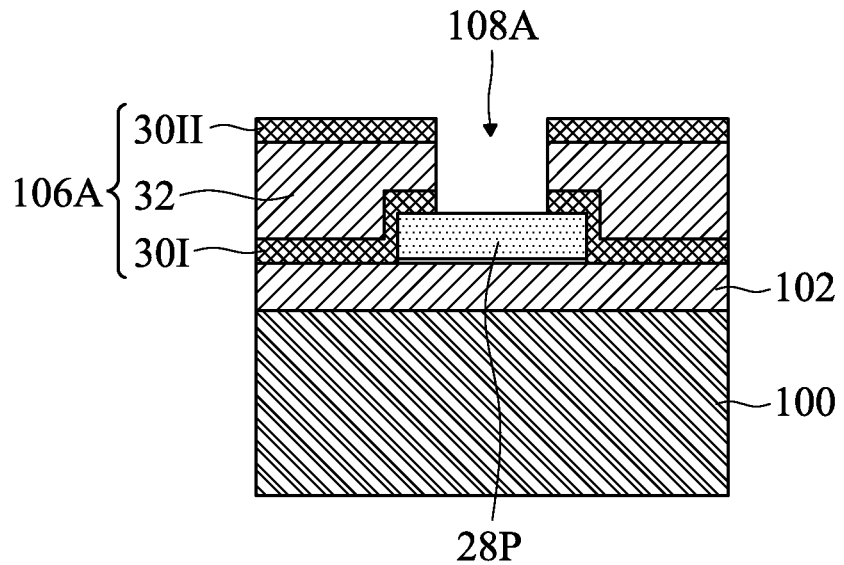
Figure 8:
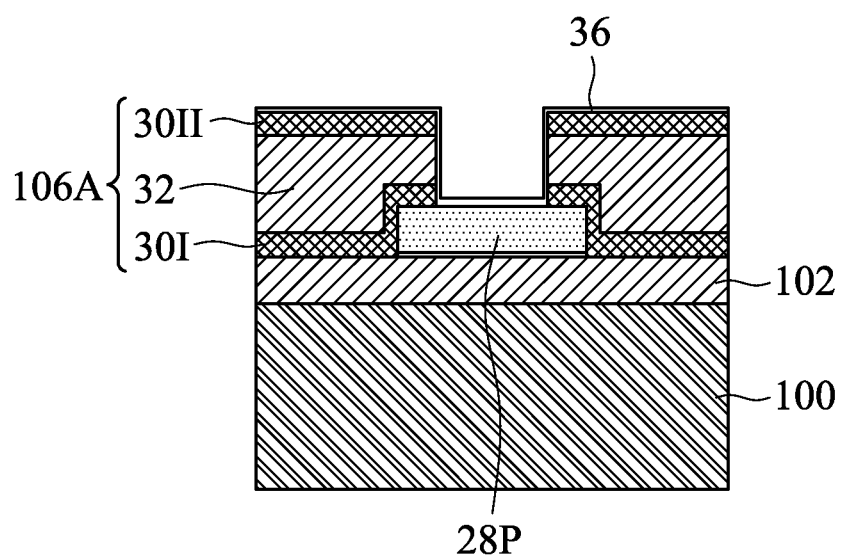
Figure 9:
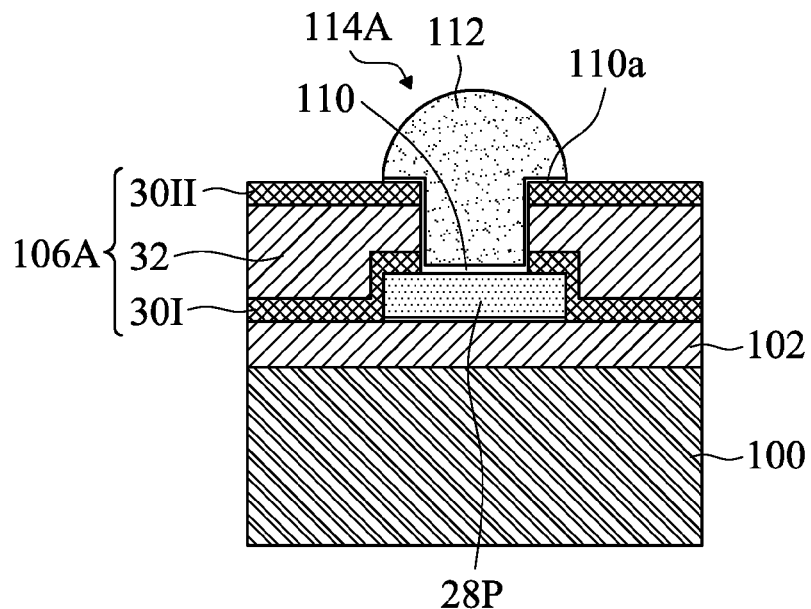

Next as shown in FIG. 7, using photolithography and etching processes, the opening 108A is formed to pass through the layers 30II, 32 and 30I and expose at least a portion of the landing pad region 28P. This completes the protection structure 106A. Then a metallization layer 36 is formed on the protection structure 106A followed by a bump formation process as shown in FIGS. 8 and 9. The metallization layer 36 is patterned as the UBM layer 110 underlying the bump structure 112. In an embodiment, the metallization layer 36 is formed on the surface of the protection structure 106A and the exposed surface of the landing pad region 28P. In at least one embodiment, the metallization layer 36 includes a diffusion barrier layer. The diffusion barrier layer may be formed of titanium (Ti), although it may also be formed of other materials such as titanium nitride (TiN), titanium oxide ($TiO_x$), tantalum (Ta), tantalum nitride (TaN), or combinations thereof, for example, Ti/TiN, Ti/TiN/Ti, or the like. The formation methods include physical vapor deposition (PVD) or sputtering. In at least one embodiment, the metallization layer 36 includes a copper layer on the diffusion barrier layer. The copper layer may be formed by performing PVD or sputtering. In some embodiments, the copper layer is formed of copper alloys that include silver, chromium, nickel, tin, gold, or combinations thereof.

As shown in FIG. 9, a conductive bump 112 is formed on the metallization layer 36 and fills the opening 108A. The metallization layer 36 is patterned as the UBM layer 110 underlying the conductive bump 112, and the top surface of the second protective layer 30II is therefore exposed. A bump structure 114A including the UBM layer 110 and the conductive bump 112 is therefore completed on a semiconductor device. In some embodiments, the UBM layer 110 may further include portions directly over the top surface of the second protective layer 30II to form overhang portions 110a. The conductive bump 112 may be formed before or after the step of patterning the metallization layer 36. In an embodiment, the conductive bump 112 is a solder bump which is formed by placing a solder ball on the metallization layer 36 and then the solder is reflowed. The solder bump may include a lead-free pre-solder layer, SnAg, or a solder material including alloys of tin, lead, silver, copper, nickel, bismuth, or combinations thereof. In another embodiment, the conductive bump 112 is a solder bump which is formed by using a mask layer with photolithography, solder plating and photoresist stripping processes followed by the UBM etching and solder reflow processes. In at least some embodiments, another metallization film may be plated prior to the solder plating process. For example, a copper layer, a copper alloy layer, a nickel layer, a nickel alloy layer, or combinations thereof formed by electroplating, electroless or immersion metal deposition process(es). In some embodiments, the conductive bump 112 may be a metal pillar, for example a copper pillar.

FIGS. 10-14 illustrate various intermediate stages of an exemplary method of forming the bump structure 114A with another protection structure 106B in a semiconductor device in accordance with an embodiment shown in FIG. 2. Unless specified otherwise, the reference numerals in these embodiments represent like elements in the embodiment illustrated in FIGS. 5-9.

Figure 10:
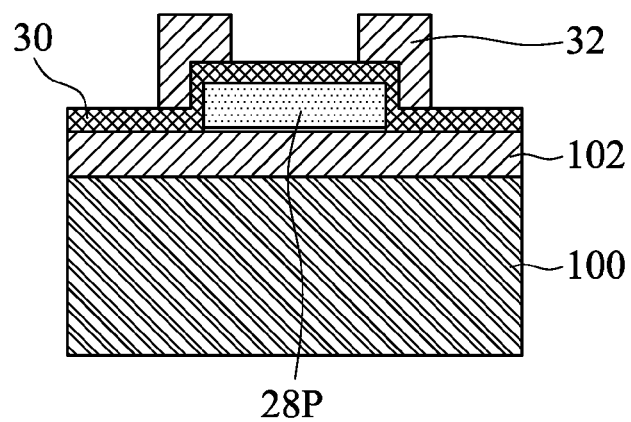
FIGS. 10-14 are cross-sectional views illustrating various intermediate stages of an exemplary method of forming a bump structure with a protection structure in a semiconductor device in accordance with an embodiment shown in FIG. 2.
Figure 11:
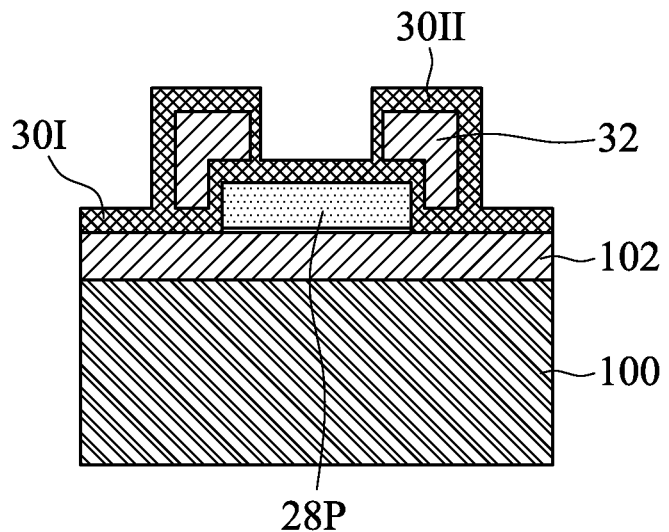

Referring to FIG. 10, after forming the first protective layer 30I and the polymer layer 32, the polymer layer 32 is patterned to expose portions of the first protective layer 30I. In an embodiment, the polymer layer 32 is removed from the portion of the first protective layer 30I on the passivation layer 102. The polymer layer 32 is also removed from the portion of the first protective layer 30I on the top surface of the landing pad region 28P. While the patterned polymer layer 32 remains on the portion of the first protective layer 30I adjacent to the sidewalls of the landing pad region 28P. Next, as shown in FIG. 11, the second protective layer 30II is formed to cover the first protective layer 30I and the polymer layer 32. Hereinafter, the protective layers 30I and 30II are described as the protective layer 30 for simplicity and clarity.

Figure 12:
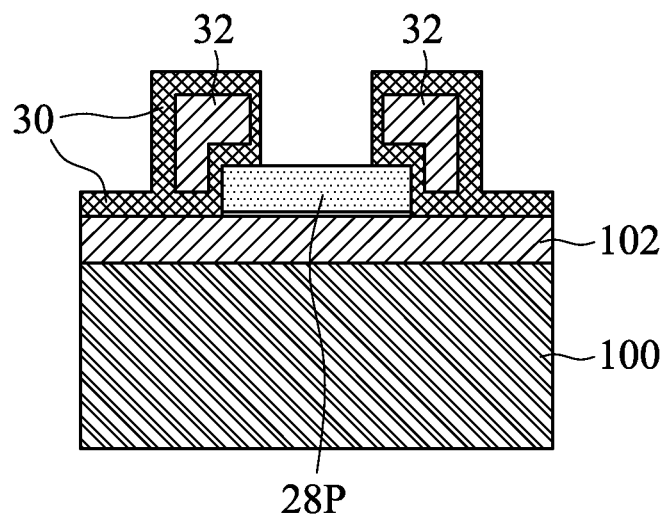

Then the protective layer 30 is removed from the top surface of the landing pad region 28P as shown in FIG. 12, which provides a window for the subsequent bump structure formation. This completes the protection structure 106B including the polymer layer 32 blocked by the portions 30a, 30b, 30c, 30d and 30e of the protective layer 30.

Figure 13:
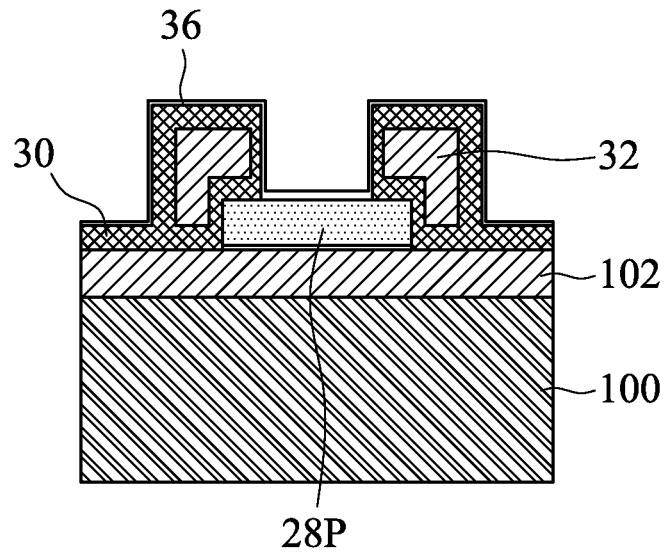
Figure 14:
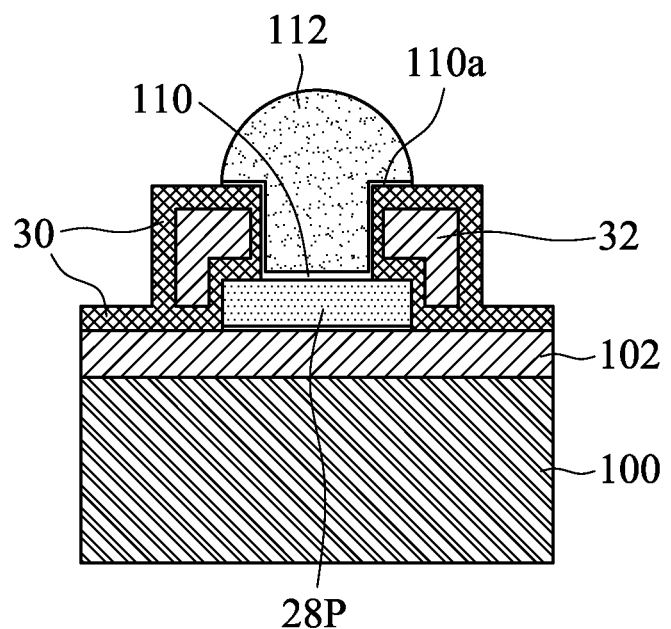

Next a metallization layer 36 is formed on the protection structure 106B followed by a bump formation process as shown in FIGS. 13 and 14. The metallization layer 36 is patterned as the UBM layer 110 underlying the bump structure 112, and the top surface of the protective layer 30 is therefore exposed. In some embodiments, the UBM layer 110 may further include portions directly over the top surface of the protective layer 30 to form overhang portions 110a. In an embodiment, the conductive bump 112 is a solder bump. In some embodiments, the conductive bump 112 may be a metal pillar, for example a copper pillar.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor device, comprising:
a semiconductor substrate;
a passivation layer over the semiconductor substrate;
a post-passivation interconnect (PPI) line overlying the passivation layer;
a protection structure overlying the passivation layer and the PPI line, wherein the protection structure has an opening at least exposing a portion of the PPI line; and
a bump structure formed in the protection structure and electrically connected to the PPI line through the opening of the protection structure;
wherein the protection structure comprises
a polymer layer having opposite top and bottom surfaces, and opposite sidewall surfaces connecting the top surface and the bottom surface, and
a dielectric layer surrounding the polymer layer, the dielectric layer covering the top surface, the bottom surface and the opposite sidewall surfaces of the polymer layer.

2. The semiconductor device of claim 1, wherein the dielectric layer is formed of silicon nitride, silicon carbide, silicon carbonitride, silicon oxycarbide, tetra-ethyl-orthosilicate (TEOS) oxide, silicon oxide, or combinations thereof.

3. The semiconductor device of claim 1, wherein one of the sidewall surfaces of the polymer layer faces the bump structure and is separated from the bump structure by the dielectric layer.

4. The semiconductor device of claim 1, wherein one of the sidewall surfaces of the polymer layer faces the bump structure and is separated from the PPI line by the dielectric layer.

5. The semiconductor device of claim 1, wherein the polymer layer has a thickness greater than 30 µm.

6. The semiconductor device of claim 1, wherein the opening of the protection structure further exposes a portion of the passivation layer adjacent to the PPI line.

7. The semiconductor device of claim 1, wherein the bump structure comprises an under-bump metallization (UBM) layer lining the opening of the protection structure.

8. The semiconductor device of claim 7, wherein the UBM layer comprises an overhang portion on a top surface of the protection structure.

9. The semiconductor device of claim 7, wherein the bump structure comprises a conductive bump formed on the UBM layer and filling the opening of the protection structure.

10. The semiconductor device of claim 9, wherein the conductive bump protrudes from a top surface of the protection structure.

11. The semiconductor device of claim 6, wherein the sidewall surface of the polymer layer is separated from the bump structure or from the PPI line by the dielectric layer.

* * * * *